(12) United States Patent  (10) Patent No.: US 8,900,998 B2
Schlesinger et al.  (45) Date of Patent: Dec. 2, 2014

(54) PROCESS FOR ELECTROLESS DEPOSITION OF GOLD AND GOLD ALLOYS ON SILICON

(71) Applicant: University of Windsor, Windsor (CA)

(72) Inventors: Mordechay Schlesinger, Windsor (CA); Robert Andrew Petro, Windsor (CA)

(73) Assignee: University of Windsor, Windsor (CA)

( * ) Notice: Subject to any disclaimer, the term of this patent is extended or adjusted under 35 U.S.C. 154(b) by 0 days.

(21) Appl. No.: 14/084,189

(22) Filed: Nov. 19, 2013

(65) Prior Publication Data
US 2014/0141609 A1 May 22, 2014

Related U.S. Application Data

(60) Provisional application No. 61/729,216, filed on Nov. 21, 2012.

(51) Int. Cl.
*H01L 21/44* (2006.01)
*H01L 21/285* (2006.01)

(52) U.S. Cl.
CPC ................................. *H01L 21/28506* (2013.01)
USPC ........... 438/678; 438/465; 438/584; 438/763; 438/758; 438/782

(58) Field of Classification Search
USPC ......... 438/114, 465, 476, 496, 584, 679, 694, 438/695, 702, 703, 758, 763, 781, 678
See application file for complete search history.

(56) References Cited

U.S. PATENT DOCUMENTS

| | | | | |
|---|---|---|---|---|
| 3,993,808 A | * | 11/1976 | Inaba et al. | 427/98.9 |
| 4,160,049 A | * | 7/1979 | Narcus | 427/277 |
| 4,168,214 A | * | 9/1979 | Fletcher et al. | 205/241 |
| 2013/0209698 A1 | | 8/2013 | Schlesinger et al. | |
| 2013/0216721 A1 | | 8/2013 | Schlesinger et al. | |

FOREIGN PATENT DOCUMENTS

| | | |
|---|---|---|
| DE | 2445319 | 4/1976 |
| GB | 924049 | 4/1963 |
| JP | 2002-053973 | 2/2002 |
| WO | WO 2012 048412 A1 | 4/2012 |

* cited by examiner

*Primary Examiner* — Thanh Y Tran

(57) ABSTRACT

A plating bath for electroless deposition of gold and gold alloy layers on such silicon-based substrates, includes $Na(AuCl_4)$ and/or other gold (III) chloride salts as a gold ion source. The bath is formed as a binary bath solution formed from mixing first and second bath components. The first bath component includes gold salts in concentrations up to 40 g/L, boric acid, in amounts of up to 30 g/L, and a metal hydroxide in amounts up to 20 g/L. The second bath component includes an acid salt, in amounts up to 25 g/L, sodium thiosulfate in amounts up to 30 g/L, and suitable acid, such as boric acid in amounts up to 20 g/L.

23 Claims, 8 Drawing Sheets

B1-Si

B2-Si

Figure 3                                  Figure 4
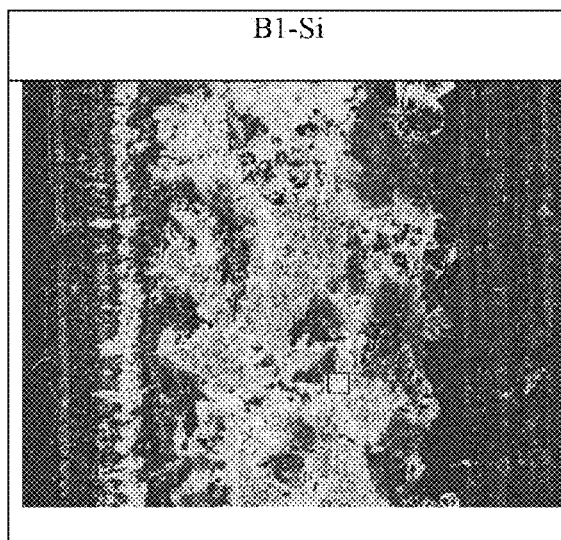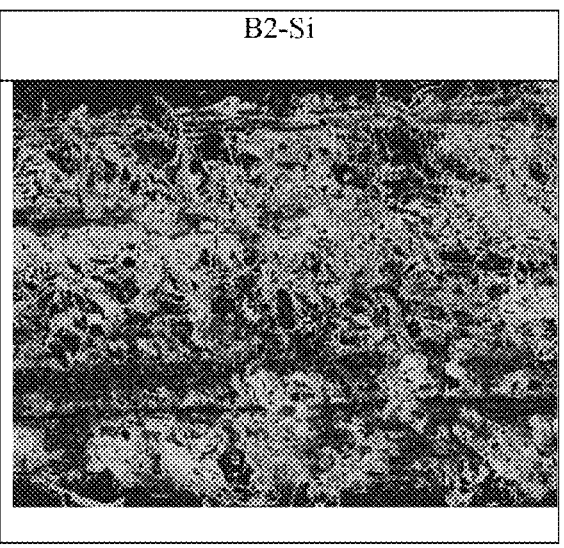

| Element | Wt% | At% |
|---|---|---|
| Silicon [Si] | 14.30 | 53.92 |
| Gold [Au] | 85.70 | 46.08 |

| Element | Wt% | At% |
|---|---|---|
| Silicon [Si] | 11.14 | 46.79 |
| Gold [Au] | 88.86 | 53.21 |

Figure 7
Figure 8
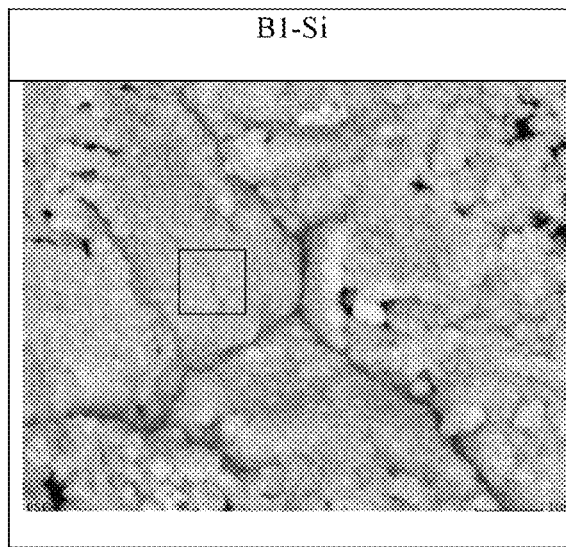
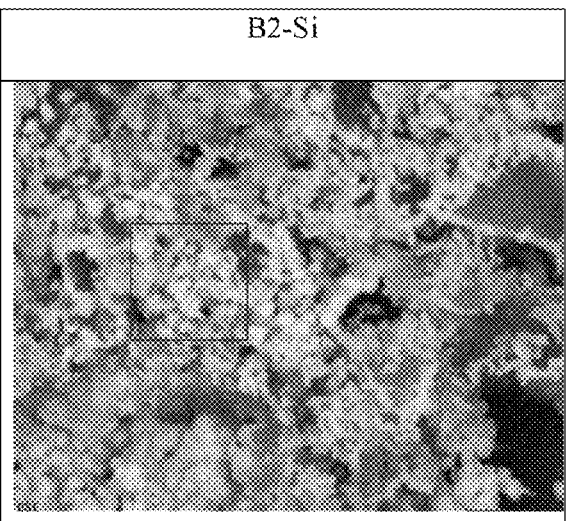

| Element | Wt% | At% |
| --- | --- | --- |
| Silicon [Si] | 04.35 | 24.16 |
| Gold [Au] | 95.65 | 75.84 |

| Element | Wt% | At% |
| --- | --- | --- |
| Silicon [Si] | 08.88 | 40.60 |
| Gold [Au] | 91.12 | 59.40 |

Figure 13
Figure 14
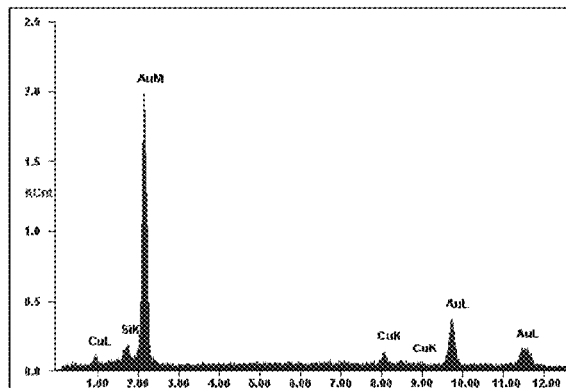
| Element | Wt% | At% |
|---|---|---|
| Silicon [Si] | 01.00 | 06.11 |
| Copper [Cu] | 04.08 | 11.04 |
| Gold [Au] | 94.92 | 82.85 |
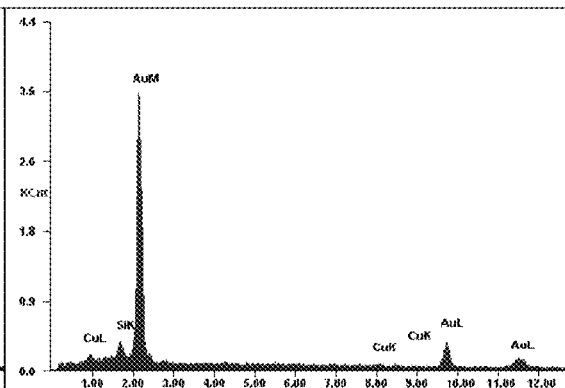
| Element | Wt% | At% |
|---|---|---|
| Silicon [Si] | 00.74 | 04.78 |
| Copper [Cu] | 02.14 | 06.08 |
| Gold [Au] | 97.12 | 89.14 |

| Element | Wt% | At% |
|---|---|---|
| Silicon [Si] | 02.42 | 14.25 |
| Copper [Cu] | 02.12 | 05.53 |
| Gold [Au] | 95.46 | 80.22 |

PROCESS FOR ELECTROLESS DEPOSITION OF GOLD AND GOLD ALLOYS ON SILICON

RELATED APPLICATIONS

This application claims the benefit of 35 USC §119(e) to U.S. Provisional Patent Application Ser. No. 61/729,216, filed 21 Nov. 2012, the disclosure of which is incorporated herein by reference in its entirety.

BACKGROUND OF THE INVENTION

Various techniques have been proposed for plating gold and gold alloys on silicon surfaces. Conventionally, electroplating processes are employed wherein a first seed layer of gold is deposited using lower current densities, and which is then annealed by heating to temperatures of about 250° C. to achieve increased adhesion. After annealing, a subsequent gold layer is electrodeposited on the seed layer to provide the gold coating layer with the final desired thickness.

SUMMARY OF THE INVENTION

The present invention provides for a process for the deposition or coating of noble metals such as gold and/or gold alloys on silicon and silicon based substrates. More particularly, the invention provides for a chemistry and process which allows for the electroless deposition of gold and gold alloy layers on such silicon-based substrates, and which in most preferred applications may achieve gold layer deposits ranging in thickness from less than 1 micron to 500 microns or more, depending upon the intended application.

In accordance with one preferred method, a silicon wafer or other silicon-based substrate is immersed in plating bath solution having a pH which is preferably selected at between 6 and 9, and more preferably which is generally basic having a pH of from about 7 to 10, and preferably of between about 7 and 8. The plating bath includes a gold salt as a gold ion source. Such salts may for example, include without restriction, $Na(AuCl_4)$ and/or other gold (III) chloride salts.

The plating bath is preferably formed as a binary bath solution to which a reducing agent may optionally be added to facilitate the reaction process. In one possible embodiment, a first bath component is provided which includes one or more selected gold salts in concentrations up to 40 g/L, and preferably up to about 5 g/L by bath volume; an acid, and preferably boric acid, in amounts of up to 30 g/L, and preferably up to 20 g/L by bath volume; and a metal hydroxide, such as sodium hydroxide in amounts up to 20 g/L, and preferably up to about 7.5 g/L by bath volume. The second bath component includes an acid salt, and preferably sodium sulfite, in amounts up to 25 g/L, and preferably up to about 15 g/L by bath volume; sodium thiosulfate in amounts up to 30 g/L, and preferably up to about 25 g/L; and suitable acid, such as boric acid in amounts up to 20 g/L, and preferably up to about 15 g/L by total bath volume.

Reducing agents to be used in the plating bath may include without restriction, one or more of $NaH_2PO_2$ and/or $NA_3C_6H_5O_7$ in amounts up to about 9 g/L, and preferably up to about 5 g/L by total bath volume.

The individual bath components may be simultaneously added to the baths. Most preferably, the components are prepared and maintained as separate volumes prior to mixing to provide the plating bath solution. The second bath component is provided for mixing with the first bath component in a 2:1 to 1:2, and preferably about a 1:1 volumetric ratio. Preferably, the bath components are mixed within 48 hours of the commencement of plating operations, and allowed to complex prior to the addition of the reducing agent.

Optionally, a reactive copper or other secondary reactive metal substrate may be added to the bath as a reaction promoter In electroplating a silicon or silicon-based substrate, the substrate to be plated may be pretreated to remove some or substantially all oxides present from the portions of the substrate to be plated, prior to immersion in the plating bath. Oxide removal may be effected in a number of manner, including mechanical grinding, scribing or abrasion, sanding machining or by laser ablating; or in an alternative process, by chemical and/or plasma etching.

In a more preferred possible embodiment, oxide layers are selectively removed in preselected patterns or areas from the individual portions of the substrate to be plated, whereby oxide coatings are permitted to remain on the remaining substrate portions which are intended to remain substantially gold free.

Following oxide removal, the substrate is immersed in the plating bath, with the bath temperature selected at between about 20° C. to 95° C., preferably between about 40° C. and 80° C., and most preferably at about 60° C.±10° C. In preferred commercial applications, and depending on the plating thickness to be achieved, immersion is effected for periods of up to 72 hours, and preferably from 0.5 to 2 hours. It is to be appreciated, however, that shorter or longer immersion times will be used, depending upon the final desired thickness of the gold layer deposition to be achieved.

Accordingly, in one aspect, the present invention resides in a process for electroless coating gold or gold alloy on a substrate comprising: preparing a plating bath comprising, a first bath component, a second bath component, and a reducing agent, the first bath component comprising, about 0.75 to 5 g/L $Na(AuCl_4)$, about 1 to 15 g/L $H_3BO_3$, and up to 3 g/L NaOH, the second bath component comprising, about 1 to 20 g/L $Na_2SO_3$, about 5 to 25 g/L $Na_2S_2O_3$, and about 3 to 20 g/L $H_3BO_3$, immersing said substrate in said plating bath.

In another aspect, the present invention resides in a method for preparing an electroless plating bath for plating gold or gold alloy on at least part of a silicon or silicon-based substrate, said method comprising: preparing a first bath component comprising, based on total bath volume, about 1.5 to 2.5 g/L $Na(AuCl_4)$, about 3 to 15 g/L $H_3BO_3$, and up to 3 g/L NaOH, preparing a second bath component comprising, based on total bath volume, about 2.5 to 15 g/L $Na_2SO_3$, about 7 to 20 g/L $Na_2S_2O_3$, and about 3 to 15 g/L $H_3BO_3$, mixing the first and second bath components, adding at least one reducing agent selected from the group consisting of sodium hypophosphite and sodium citrate.

In yet a further aspect a process for electroless coating gold or gold alloy on a substrate comprising: preparing a plating bath comprising, a first bath component, a second bath component, and a reducing agent, the first bath component comprising, based on the total bath volume, about 1 to 4 g/L $Na(AuCl_4)$, about 8 to 13 g/L $H_3BO_3$, and up to 0.75 g/L NaOH, the second bath component comprising, about 3 to 15 g/L $Na_2SO_3$, about 8 to 18 g/L $Na_2S_2O_3$, and about 8 to 12 g/L $H_3BO_3$, and wherein the first bath component and the second bath component are provided in about a 2:1 to 1:2 volumetric ratio, the reducing agent comprising at least one of sodium hypophosphate and sodium citrate added to said plating bath in an amount of from about 1 to about 6 g/L, based on the total bath volume, and immersing said substrate in said plating bath.

In another aspect, plating is effected on a silicon substrate in which surface oxidized layers are partially or wholly removed. In one possible embodiment, silicon oxide removal is effected by scribing or other mechanical abrasion; or alternately by laser, optical or other chemical processes. In one possible method of manufacture, scribed lines are formed through the oxide layer to expose narrow grooves where oxides are absent or exist only in minute or trace amounts. Following oxide removal, the substrate is immersed in a plating bath, whereby alloy layers of gold are deposited. The applicant has appreciated that with the present process, the formed plating layer will tend to selectively adhere or adhere more strongly to the oxide free portions of the substrate, enabling the selective deposition of gold in areas of the substrate which have been scribed or otherwise where the silicon oxide has been removed.

In yet a further aspect, the invention resides in a binary deposition bath for plating gold on silicon/silicon oxide substrates which is formed from mixing bath components, Bath A and Bath B, together with one or more bath stabilizers, additives and/or reducing agents, and which includes:

|  | Chemical Name | Formula | Electrolyte Composition Range | Sample |
|---|---|---|---|---|
| Bath A | Sodium Tetrachloro-aurate(III) Dihydrate | $NaAuCl_4 \cdot 2H_2O$ | 0.5-5.0 g/L | 2 g/L |
|  | Boric Acid and/or Hydrogen Borate | $H_3BO_3/HBO_3$ | 5-20 g/L | 10 g/L |
| Bath B | Sodium Sulfite | $Na_2SO_3$ | 0.5-25 g/L | 13 g/L |
|  | Sodium Thiosulfate | $Na_2S_2O_3$ | 0.5-25 g/L | 16 g/L |
|  | Boric Acid and/or Hydrogen Borate | $H_3BO_3/HBO_3$ | 5-20 g/L | 10 g/L |
| Additives | Sodium Citrate Tribasic Dihydrate | $Na_3C_6H_5O_7 \cdot 2H_2O$ | 0-200 g/L | 147 g/L |
|  | Sodium Hypophosphite Hydrate | $NaH_2PO_2 \cdot H_2O$ | 0-20 g/L | 8 g/L |

In a preferred method of preparation, Bath Components A and B are mixed together in a ratio of between about 2:1 to 1:2, and preferably at about 1:1 and left to complex prior to the introduction of the additives. Although not essential, NaOH may be added to the electrolyte deposition bath to provide the bath with the derived pH. Optionally, thiosulfate $[S_2O_3^{2-}]$ and sulfite $[SO_3^{2-}]$ may be provided within the electrolyte to enhance the stability of the electrolyte solution. It is more preferred that both thiosulfate and sulfite be present in combination, as the absence of thiosulfate with sulfite may result in a reduction in deposition bath stability.

BRIEF DESCRIPTION OF THE DRAWINGS

Reference may now be had to the following detailed description taken together with the accompanying drawings, in which:

FIG. 3 shows a scanning electron microscope image showing the morphology of the gold deposit layer on the silicon substrate illustrated in FIG. 1;

FIG. 4 shows a scanning electron microscope image showing the morphology of the gold deposit layer on the silicon substrate illustrated in FIG. 2;

FIG. 7 show an enlarged isolated view of the gold deposition layer of the coated silicon substrate shown in FIG. 3;

FIG. 8 shows an enlarged isolated view of the gold deposition layer formed of the coated silicon substrate shown in FIG. 4;

FIGS. 13 and 14 show graphically the elemental weight content of silicon, copper and gold of the gold deposit layers shown in FIGS. 11 and 12, respectively;

SCOPE OF THE INVENTION

Figures 1, 2:
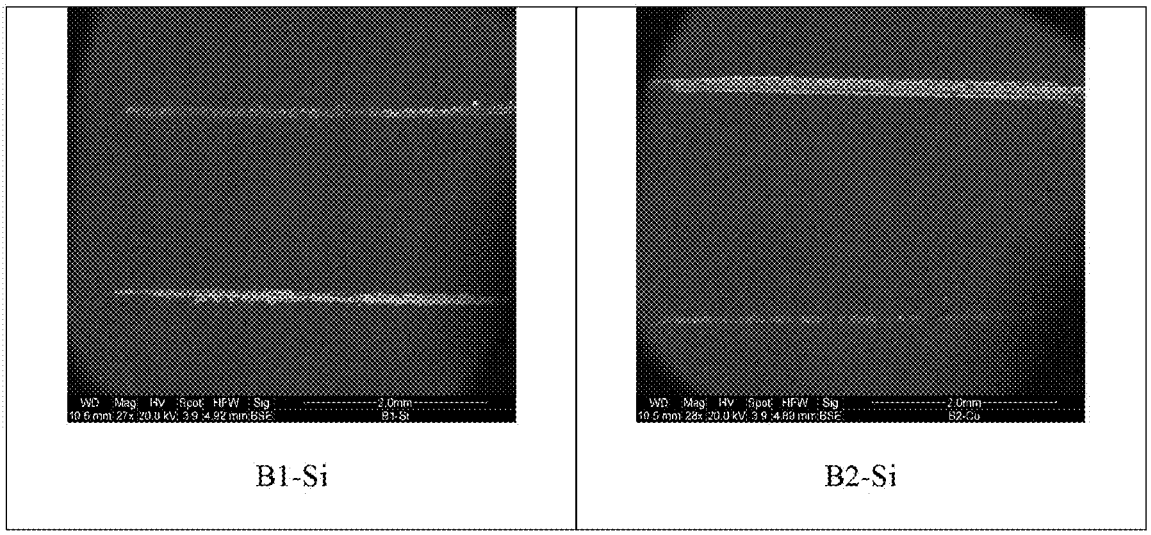
FIG. 1 shows backscatter electron microscope image of a plated silicon substrate test piece formed using a first electroless plating bath, in accordance with a first embodiment of the invention.
FIG. 2 shows a backscatter electron microscope image of a plated silicon-substrate test piece formed using a second electroless plating bath, in accordance with a second embodiment of the invention.

The present invention provides for a method and process for the coating of gold and/or gold alloys on silicon, silicon-based substrates and the like. More particularly, the present invention provides for a chemistry and process by which gold and/or gold alloys, may be deposited on selected substrates, such as silicon wafers used in semi-conductors and the like, using an electroless deposition process.

To effect plating the silicon substrate is immersed in a plating deposition bath having a bath temperature selected at between about 50° C. to 60° C., and which has a pH of from about 7 to about 8. Preferably, bath is formulated as a mixture of at least two primary bath components which have been pre-prepared as part of a batch process. A first bath component includes, based on total bath volume, a gold ion source such as $Na(AuCl_4)$, in an amount of 0.75 to 5 g/L, and preferably about 1.5 to 2.5 g/L; 0.5 to 15 g/L $H_3BO_3$ and up to 3 g/L NaOH. The second bath component is provided for mixing with the first, and includes 2.5 to 15 g/L $Na_2SO_3$; $Na_2S_2O_3$ in an amount of about 7 to 20 g/L; and about 5 to 15 g/L $H_3BO_3$.

Optionally, the plating bath may be provided with a secondary solid or reactive metal substrate, and which may include nickel, copper, silver, gold or their alloys. Without being bound to a particular theory, it is believed that the presence of such reactive metal substrates advantageously effect the early stages of deposition to thereby speed the overall gold deposition rate. It is believed that the combination of the exposed catalytic surface with the difference in nobility between the initial substrate and the deposited metal(s) facilitates and promotes selective deposition.

a) Exemplary Embodiment

Electroless Gold Deposition

In a first exemplary embodiment, two separate formulations of gold deposition baths (Bath 1 and Bath 2) were prepared for use in the electroless plating of gold or silicon. Each of the Bath 1 and Bath 2 deposition baths were prepared as generally binary bath solutions, formulated by mixing in a 1:1 volumetric ratio a single pre-prepared stock Bath Component A, and a respective different Bath Components B1 and B2. In particular, the common Bath Component A, and Bath Component B1 and B2 were prepared with the following compositions shown in Table 1 as follows:

TABLE 1

| Bath A | mol/L | g/mol | g/L | 40 mL | Actual | pH-litmus | pH-meter @ 18.9 C. |
|---|---|---|---|---|---|---|---|
| 1) $Na(AuCl_4)$ | 0.005 | 397.8 | 1.9890 | 0.07956 g | 0.08 | | |
| 2) $H_3BO_3$ | 0.16 | 61.83 | 9.8928 | 0.39571 g | 0.396 | 3 | |
| 3) NaOH | 0.00656 | 40 | 0.2625 | 0.021 g | 0.021 | 7 | 6.58 |

| Bath B1 | mol/L | g/mol | g/L | 20 mL | Actual | pH-litmus | pH-meter @ 18.9 C. |
|---|---|---|---|---|---|---|---|
| 1) $Na_2SO_3$ | 0.1 | 126.04 | 12.6040 | 0.252 g | 0.252 | | |
| 2) $Na_2S_2O_3$ | 0.1 | 158.11 | 15.8110 | 0.31622 g | 0.316 | | |
| 3) $H_3BO_3$ | 0.16 | 61.83 | 9.8928 | 0.19786 g | 0.198 | 7 (high) | 7.76 |

| Bath B2 | mol/L | g/mol | g/L | 20 mL | Actual | pH-litmus | pH-meter @ 18.9 C. |
|---|---|---|---|---|---|---|---|
| 1) $Na_2SO_3$ | 0.035 | 126.04 | 4.4114 | 0.088 g | 0.088 | | |
| 2) $Na_2S_2O_3$ | 0.065 | 158.11 | 10.2772 | 0.20554 g | 0.2065 | | |
| 3) $H_3BO_3$ | 0.16 | 61.83 | 9.8928 | 0.19786 g | 0.198 | 7(high) | N/A |

In sample testing 20 mL of Bath Component A was added to each respective Bath Component B1 and Bath Component B2 in a 1:1 volumetric ratio, using a pipette at a rate of <1.3 mL/min, to form two 40 mL binary deposition baths (Bath 1 and Bath 2).

Bath Component B2 was formulated to test an overall lower atomic sulfur composition of the plating bath, having 65% of the sodium thiosulfate and 35% of the sodium sulfite to that present in the formulated Bath 1 bath using Bath Component B1. The thiosulfate was added to each plating bath to increase the deposition rate of the electroless gold, while the sodium sulfite is provided to act as a bath stabilizer.

After mixing, each of the formed deposition baths were allowed to sit and complex for 24 hours. After 24 hours sodium hypophosphite and sodium citrate were added as reducing agents to each deposition bath in amounts of 4 g/L and 1 g/L, respectively, with final reducing agents present as shown in Table 2.

TABLE 2

| | mol/L | g/mol | g/L | 80 mL | Actual |
|---|---|---|---|---|---|
| Bath 1 (with reducing Agent B1) | | | | | |
| 1) Addition $NaH_2PO_2$ | 0.04546 | 87.98 | 4 | 0.320 g | 0.322 |
| 2) Addition $Na_3C_6H_5O_7$ | 0.0034 | 294.1 | 1 | 0.08 g | 0.081 |
| Bath 2 (with reducing Agent B2) | | | | | |
| 1) Addition $NaH_2PO_2$ | 0.04546 | 87.98 | 4 | 0.320 g | 0.323 |
| 2) Addition $Na_3C_6H_5O_7$ | 0.0034 | 294.1 | 1 | 0.08 g | 0.081 |

The final formulations of the test Bath 1 and Bath 2 deposition baths were therefore as shown in Table 3 as follows:

TABLE 3

| | | Bath 1 | Bath 2** |
|---|---|---|---|
| Sodium tetrachloroaurate (III) | $Na(AuCl_4)$ | 1.9890 g/L | 1.9890 g/L |
| Boric Acid | $H_3BO_3$ | 9.8928 g/L | 9.8928 g/L |
| Sodium Sulfite | $Na_2SO_3$ | 12.6040 g/L | 4.4114 g/L |
| Sodium Thiosulfate | $Na_2S_2O_3$ | 15.8110 g/L | 10.2772 g/L |
| Boric Acid | $H_3BO_3$ | 9.8928 g/L | 9.8928 g/L |
| Sodium Hypophosphite | $NaH_2PO_2$ | 4.0000 g/L | 4.0000 g/L |
| Sodium Citrate | $Na_3C_6H_5O_7$ | 1.0000 g/L | 1.0000 g/L |
| Formulation | | Standard | Low Sulfur |
| pH (litmus)* | | 7.8 | 7.4 |
| pH (meter) @ 21.6 C. | | 7.62 | 7.45 |

TABLE 3-continued

| | Bath 1 | Bath 2** |
|---|---|---|
| Operating Temperature | 52° C. | 52° C. |

*Decimal estimated based on color
**Bath 2 contains 65% of the Sodium Thiosulfate and 35% of the Sodium Sulfite of Bath 1

In test plating, using tungsten carbide diamond scribe and metal tweezers lines were scratched in the sample pieces of n-type silicon [Si] to selectively remove oxides using both a tungsten carbide tip, as well as a diamond bit. A scribed silicon part or test piece (B1-Si, B2-Si) was then placed in each respective Bath 1 and Bath 2 deposition bath at temperatures of 52° C. for 100 minutes. After removal of the initial test pieces (B1-Si, B2-Si), two more silicon test piece parts (B1-Cu, B2-Cu) were scribed in the same way, and placed in the respective Bath 1 and Bath 2 deposition baths along with a piece of substantially oxide free polished copper for around 30 minutes (test pieces B1-Cu; B2-Cu).

After bath immersion, all of the test parts B1-Si, B2-Si, B1-Cu and B2-Cu were visually analyzed using a scanning electron microscope and shown as housing some gold deposit thereon within most of the scribed areas, whilst exhibiting substantially no significant gold deposition apparent on remaining oxidized areas (see for example FIGS. 1 and 2). Some of the test piece scribed areas were shown with no or reduced gold deposition. Upon investigation, however, the portions of scribed lines exhibiting reduced gold plating were shown to have been scribed less deeply as compared to the scribed areas possessing thick gold deposits, and hence the presence of a residual thin oxide layer is believed likely.

b) Energy Dispersive X-Ray Spectrometry (EDS) Results i) B1-Si and B2-Si Samples With reference to FIGS. 1 to 4, 7, 8, 11, 12 and 15 the following indicated nomenclature is used:

| | |
|---|---|
| B1 - Designates Bath 1 | Si - Designates the 1$^{st}$, 100 minute trial, wherein the Si substrate alone is immersed in the deposition bath |
| B2 - Designates Bath 2 | Cu - Designates the 2$^{nd}$, 30 minute trial, wherein the Si substrate and reactive Cu substrate were co-immersed in the deposition bath |

FIGS. 1 and 2 show that as expected, when playing the silicon test pieces B1-Si, B2-Si the shallower scribed areas of each test piece B1-Si, B2-Si showed reduced levels of gold deposition which was attributed to the lack of oxide removal. The tungsten carbide and diamond scribes, as well as a scratch from a pair of tweezers, were shown as sufficient to remove the oxide layer from the silicon to allow for gold layer deposition.

Figure 5:
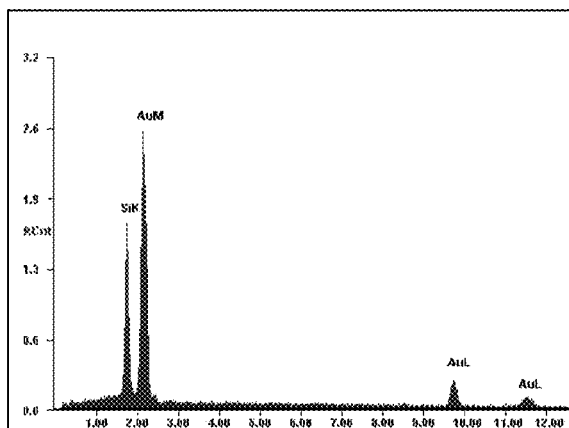
FIGS. 5 and 6 illustrate graphically the elemental weight content of the silicon and gold for the deposit layers shown in FIGS. 3 and 4 respectively.
Figure 6:
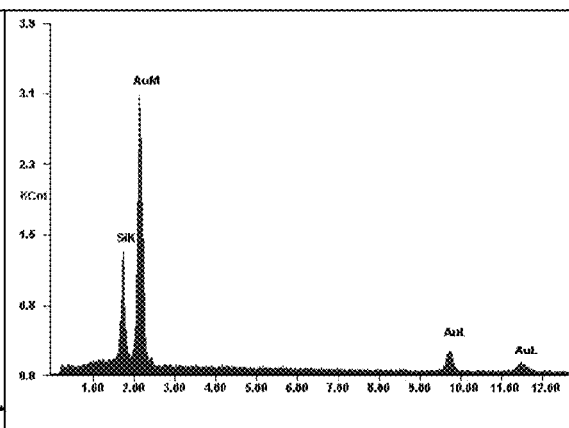

The first set of samples, B1-Si and B2-Si, returned substantially pure gold deposits on the silicon substrate, as for example is shown in FIGS. 3 and 4. The different composition of the Bath 1 and Bath 2 deposition baths however, appeared to affect the chemical morphology of the individual formed deposit layers on each of test piece B1-Si and B2-Si, as shown graphically in FIGS. 5 and 6, respectively.

Figure 9:
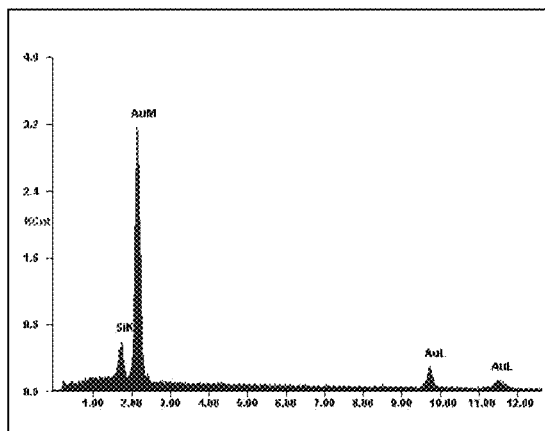
FIGS. 9 and 10 illustrate graphically the elemental silicon and gold content of the isolated layer components illustrated in FIGS. 7 and 8 respectively.
Figure 10:
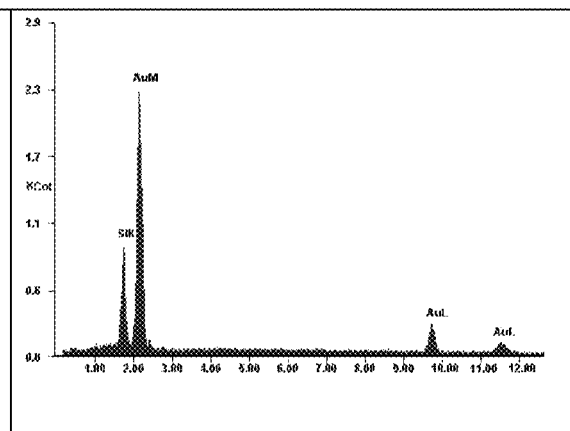

Greater magnification of targeted areas of the thicker portions of the formed gold coating layer illustrated in FIGS. 3 and 4 are shown respectively in FIGS. 7 and 8, and allows for a better targeted EDS analysis. The analysis of the thicker portions of the gold-formed plating of test pieces B1-Si and B2-Si confirm that substantially the only component of the deposit on the silicon achieved by bath solutions B1 and B2 is pure gold, as for example is illustrated graphically in FIGS. 9 and 10, respectively.

ii) B1-Cu and B2-Cu Samples

Figures 11, 12:
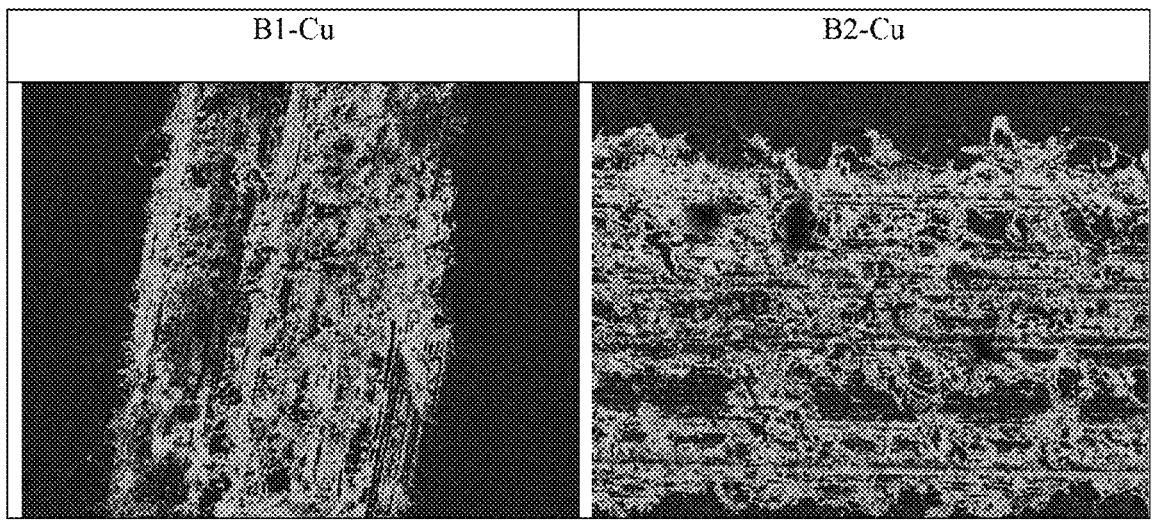
FIG. 11 shows a scanning electron microscope image showing the morphology of the gold deposit layer formed on a silicon substrate test piece using the first bath solution in accordance with the first embodiment, with the addition of a secondary reactive copper metal substrate.
FIG. 12 shows a scanning electron microscope image showing the morphology of the gold deposit layer formed on a silicon substrate test piece using the second bath solution in accordance with the second embodiment, with the addition of a secondary reactive copper metal substrate.
Figure 15:
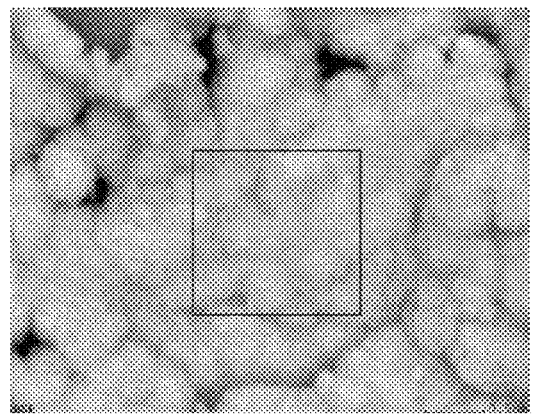
FIG. 15 shows an enlarged isolated view of the gold deposition layer of the coated silicon substrate shown in FIG. 11.
Figure 16:
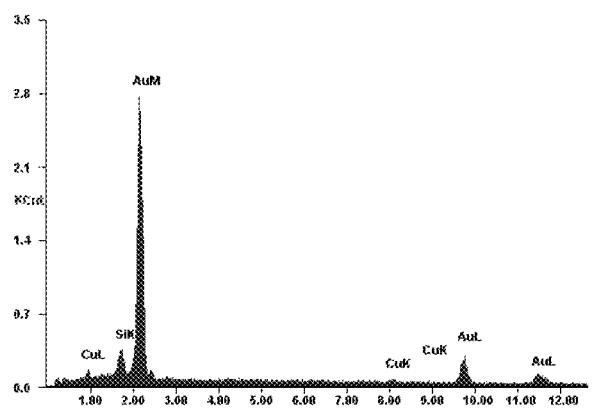
FIG. 16 illustrates graphically the silicon, copper and gold content of the coating layer of the isolated layer components, illustrated in FIG. 15.

In the second set of test deposits B1-Cu and B2-Cu undertaken where a reactive copper substrate was added to each bath solution, Bath 1 and Bath 2, returned deposits of gold on the B1-Cu and B2-Cu substrates at faster deposition rates (see for examples FIGS. 11 and 12). The analysis of the coating layer formed on each test piece B1-Cu, B2-Cu showed the formation of gold deposits on the silicon having some Cu content, typically below 10% atomic (see FIGS. 13 and 14). The presence of copper in the gold deposit formed on the silicon is believed to result from a simple displacement reaction catalyzing the deposition of gold on the reactive Cu substrate. The copper content in the gold deposit is linked to the amount of Cu present in solution, which further appears to be linked to the amount of sodium thiosulfate [$Na_2S_2O_3$] present in the deposition bath. Gold deposit layers containing Cu, however, appeared to form more quickly and appear more continuous, as shown in the enlarged view of the deposit layer formed on test piece B1-Cu shown in FIG. 15. Further, in the chemical analysis of the thicker portions of the coating layer formed using bath solution B1-Cu illustrated in FIG. 16 confirms the formed layer as achieving in excess of 95% by weight pure gold.

The applicant has thus appreciated that with the binary plating bath solution of the present invention in a preferred plating process:

1. Oxide is preferably substantially removed from the portions of the silicon or the silicon-based substrate which are to be gold plated, before bath immersion, and the commencement of gold or gold alloy plating to the silicon/substrate surface.
2. Oxides may be removed selectively from the silicon or silicon substrate by removing oxide layers mechanically as for example, by machining, grinding or scribing operation; or in an alternate process, by laser machining.
3. Gold/Gold alloys may advantageously be placed selectively onto the silicon surfaces, as for example by maintaining oxides or oxide layers on selected portions of the silicon which are to remain unplated.

In a further possible aspect, it has been recognized that the semiconductor of Germanium-Arsenic will grow on Si, where the Si is covered by gold. To date Germanium-Arsenic wires have been grown by placing gold nano-particles onto Si and thereafter placing the silicon into a chamber where Germanium-Arsenic vapor is introduced. In such a process, Germanium-Arsenic nano-wires form under the gold, raising the gold off the Si surface as the wire grows.

The applicant has recognized that in an alternate process of manufacture, gold may be selectively deposited on the substrate or silicon surface by the selected removal of oxide, and thereafter using the present plating solution. By then placing the gold plated silicon into a chamber for exposure to Germanium-Arsenic vapour, a germanium-arsenic structure may subsequently be grown in the shape of the gold deposit. As a result, the preferred gold plating process may advantageously be useful as an intermediate step in the manufacture of vapour deposition grown germanium-Arsenic microcircuits or chips.

Although the detailed description describes and illustrates a preferred plating bath composition method of electroless plating, the invention is not strictly limited to the precise embodiments which are described. Many modifications and variations will now occur to persons skilled in the art. For a definition of the invention, reference may be had to the appended claims.

We claim:

1. A process for electroless coating gold or gold alloy on a substrate comprising:
   preparing a plating bath comprising,
   a first bath component, a second bath component, and a reducing agent,
   the first bath component comprising,
      about 0.75 to 5 g/L $Na(AuCl_4)$,
      about 1 to 15 g/L $H_3BO_3$, and
      up to 3 g/L NaOH,
   the second bath component comprising,
      about 1 to 20 g/L $Na_2SO_3$,
      about 5 to 25 g/L $Na_2S_2O_3$, and
      about 3 to 20 g/L $H_3BO_3$,
   immersing said substrate in said plating bath.

2. The process as claimed in claim 1, wherein said substrate is immersed in said plating bath for between about 0.2 and 6 hours.

3. The process as claimed in claim 1, wherein said substrate comprises a silicon or silicon-based substrate.

4. The process as claimed in claim 1, wherein said plating bath has a pH selected at between about 7 and 9.

5. The process as claimed in claim 1, wherein during immersion of said substrate, maintaining said plating bath at a temperature of between about 40° C. and 70° C.

6. The process as claimed in claim 1, wherein the reducing agent comprises at least one of sodium hypophosphite and sodium citrate.

7. The process as claimed in claim 6, wherein the reducing agent comprises $NaH_2PO_2$ in an amount of between about 2 to 6 g/L based on total bath volume.

8. The process as claimed in claim 6, wherein the reducing agent comprises $Na_3C_6H_5O_7$ in an amount of between about 0.5 and 3 g/L based on total bath volume.

9. The process as claimed in claim 1, wherein the first bath component and said second bath component are pre-prepared independently, and after preparation mixed together as a batch process.

10. The process as claimed in claim 9, wherein the first bath component is added to the second bath component in an approximately 1:1 volumetric ratio.

11. The process as claimed in claim 1, wherein while immersing said substrate, providing a reactive solid metal substrate in said plating bath, said reactive solid metal substrate being selected from the group consisting of gold, silver and copper.

12. The process as claimed in claim 11, wherein said reactive metal comprises generally oxide free copper substrate.

13. The process as claimed in claim 1, wherein prior to immersion of said substrate, selectively removing substantially all silicon oxide from surfaces of said silicon or silicon-based substrate to be plated.

14. A method for preparing an electroless plating bath for plating gold or gold alloy on at least part of a silicon or silicon-based substrate, said method comprising:
    preparing a first bath component comprising, based on total bath volume,
        about 1.5 to 2.5 g/L $Na(AuCl_4)$,
        about 3 to 15 g/L $H_3BO_3$, and
        up to 3 g/L NaOH,
    preparing a second bath component comprising, based on total bath volume,
        about 2.5 to 15 g/L $Na_2SO_3$,
        about 7 to 20 g/L $Na_2S_2O_3$, and
        about 3 to 15 g/L $H_3BO_3$,
    mixing the first and second bath components,
    adding at least one reducing agent selected from the group consisting of sodium hypophosphite and sodium citrate.

15. The method of claim 14, wherein the reducing agent is added in an amount based on total volume of said bath, of up to about 5 g/L.

16. The method of claim 15, wherein the pH of the bath is adjusted to between about 7 and 8, and further comprising maintaining a bath temperature of between about 50° C. and 60° C., and wherein said at least part of said substrate comprises a substantially oxide-free part of said substrate.

17. The method of claim 14, wherein the reducing agent comprises $NaH_2PO_2$ in an amount of between about 2 to about 6 g/L, based on total bath volume.

18. The method of claim 14, wherein the reducing agent comprises $Na_3C_6H_5O_7$ in an amount of between about 0.5 and about 3 g/L, based on the total bath volume.

19. The method of claim 14, wherein the first bath component and said second bath component are prepared independently and mixed together as a batch process, in an approximately 1:1 volumetric ratio.

20. The method of claim 14 further comprising adding a reactive solid metal substrate to said bath, said reactive metal substrate being selected from the group consisting of gold, silver and copper.

21. A process for electroless coating gold or gold alloy on a substrate comprising:
    preparing a plating bath comprising,
    a first bath component, a second bath component, and a reducing agent,
        the first bath component comprising, based on the total bath volume,
            about 1 to 4 g/L $Na(AuCl_4)$,
            about 8 to 13 g/L $H_3BO_3$, and
            up to 0.75 g/L NaOH,
        the second bath component comprising,
            about 3 to 15 g/L $Na_2SO_3$,
            about 8 to 18 g/L $Na_2S_2O_3$, and
            about 8 to 12 g/L $H_3BO_3$,
        and wherein the first bath component and the second bath component are provided in about a 2:1 to 1:2 volumetric ratio,
        the reducing agent comprising at least one of sodium hypophosphate and sodium citrate added to said plating bath in an amount of from about 1 to about 6 g/L, based on the total bath volume, and
    immersing said substrate in said plating bath.

22. The process as claimed in claim 21, wherein said substrate is immersed in said plating bath for up to 8 hours.

23. The process as claimed in claim 21, wherein prior to immersion substantially removing oxides from portions said substrate to be plated.

* * * * *